US009051176B2

(12) United States Patent
Mason (10) Patent No.: US 9,051,176 B2
(45) Date of Patent: Jun. 9, 2015

(54) MASSIVELY PARALLEL ASSEMBLY OF COMPOSITE STRUCTURES USING DEPLETION ATTRACTION

(75) Inventor: Thomas G. Mason, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 1621 days.

(21) Appl. No.: 12/524,946

(22) PCT Filed: Feb. 4, 2008

(86) PCT No.: PCT/US2008/001443
§ 371 (c)(1),
(2), (4) Date: Jul. 29, 2009

(87) PCT Pub. No.: WO2008/097502
PCT Pub. Date: Aug. 14, 2008

(65) Prior Publication Data
US 2009/0324904 A1    Dec. 31, 2009

Related U.S. Application Data

(60) Provisional application No. 60/899,036, filed on Feb. 2, 2007, provisional application No. 60/898,997, filed on Feb. 2, 2007.

(51) Int. Cl.
*B81C 3/00* (2006.01)
*B81C 99/00* (2010.01)
*G03F 7/40* (2006.01)

(52) U.S. Cl.
CPC ....... *B81C 99/008* (2013.01); *Y10T 428/24802* (2015.01); *B81C 3/005* (2013.01); *B81C 3/002* (2013.01); *B81C 2203/057* (2013.01); *B81C 2201/0159* (2013.01); *B81C 2201/0149* (2013.01); *G03F 7/40* (2013.01)

(58) Field of Classification Search
CPC ........ B81C 3/001; B81C 3/002; B81C 3/005; B81C 3/007; B81C 99/008; B81C 2201/0149; B81C 2201/0159; B81C 2203/054; B81C 2203/057
USPC .................. 428/195.1; 977/882, 895
See application file for complete search history.

(56) References Cited

U.S. PATENT DOCUMENTS

| | | | |
|---|---|---|---|
| 6,507,989 | B1 | 1/2003 | Bowden |
| 2002/0022124 | A1* | 2/2002 | Ruoff ............................. 428/325 |
| 2006/0154466 | A1 | 7/2006 | Lee |
| 2006/0189113 | A1 | 8/2006 | Vanheusden |
| 2006/0210668 | A1 | 9/2006 | Thorsoe |

FOREIGN PATENT DOCUMENTS

WO    WO 2008/021540 A2    2/2008

OTHER PUBLICATIONS

T. G. Mason *Phys. Rev.* E 2002.
Hernandez and Mason, *J. Phys. Chem.* C 111 4477-4480 (2007).
Whitesides, G. M.; Grzybowki, B. Science 2002, 295, 2418.
Antl, L.; Goodwin, J. L.; Hill, R. D.; Ottewill, R. H.; Owens, S. M.; Papworth, S.; Waters, J. A. *Colloid Surf.* 1986, 17,67.
van der Kooij, F. M.; Kassapidou, K.; Lekkerkerker, H. N. W., *Nature* 2000, 406, 868.
Murphy, C. *Science* 2002, 298, 2139.
Mokari, T.; Rothenberg, E.; Popov, I.; Costi, R.; Banin, U., *Science* 2004, 304, 1787.
Manoharam, V. N.; Elsesser, M. T.; Pine, D. J., *Science* 2003, 301, 483.
Raviv, U.; Needleman, D. J.; Li, Y.; Miller, H. P.;, Wilson, L.; Safinya, C. R., *Proc Nat Acad Sci* 2005, 102, 11167.
Dinsmore, A. D.; Hsu, M. F.; Nikolaides, M. G.; Marquez, M.; Baush, A. R.; Weitz, D. A., *Science* 2002, 298, 1006.
van Blaaderen, A. *Nature* 2006, 439, 545.
Higurashi, E.; Ukita, H.; Tanaka, H.; Ohguchi, O., *Appl. Phys. Lett.* 1994, 64, 2209.
Brown, A. B. D.; Smith, C. G.; Rennie, A. R. *Phys. Rev.* E2000, 62, 951.
Sullivan, M.; Zhao, K.; Harrison, C.; Austin, R. H.; Megens, M.; Hollingsworth, A.; Russel, VV. B.; Cheng, Z.; Mason, T. G.; Chaikin, P. M., *J. Phys Condens Matter* 2003, 15, S11.
Rolland, J. P.; Maynor, B. W.; Euliss, L. E.; Exner, A. E.; Denison, G. M.; DeSimone, J. M., *J. Am Chem Soc.* 2005, 127, 10096.
Mason, T. G.; Wilking, J. N.; Meleson, K.; Chang, C. B.; Graves, S. M., *J Phys.: Condens. Matter* 2006, 18, R635.
Liu, A. J.; Nagel, S. R., *Nature* 1998, 396, 21.
Torquato, S.; Truskett, T. M.; Debenedetti, P. G., *Phys Rev Lett.* 2000, 84, 2064.
Donev, A.; Cisse, I.; Sachs, D.; Variano, E. A.; Stillinger, F. H.; Connelly, R.; Torquato, S.; Chaikin, P. M., *Science* 2003, 303, 990.
Yethiraj, A.; van Blaaderen, A., *Nature* 2003, 421, 513.
Dendukuri, D.; Pregibon, D. C.; Colloins, J.; Hatton, T. A.; Doyle, P. S., *Nature Mater.* 2006, 5, 365.
Korda, P.; Spalding, G. C.; Dufresne, E. R,; Grier, D. G., *Rev. Sci. Instr.* 2002, 73, 1956.
Frenkel, D. *Nature Mater.* 2006, 5, 85.
Gasser, U.; Weeks, E. R,; Schofield, A .; Pusey, P. N.; Weitz, D. A., *Science* 2001 , 292, 258.

(Continued)

*Primary Examiner* — Gerard Higgins
(74) *Attorney, Agent, or Firm* — Venable LLP; Henry J. Daley (57) ABSTRACT

Producing composite structures includes dispersing a first plurality of objects, a second plurality of objects, and a third plurality of objects in a fluid, the third and second plurality of objects having an average maximum dimension that is smaller than the first plurality of objects The first plurality of objects comprise a first, a second, a third and a forth object, each having mating surface regions The first and second objects' mating surfaces are complimentary and the third and forth objects' mating surfaces are complementary The first and second object aggregate together in response to the dispersing of the second plurality of objects in the fluid due to a depletion attraction between the first and the second object The third and forth object aggregate together in response to dispersing the third plurality of objects in the fluid due to a depletion attraction between the third and the fourth object.

14 Claims, 4 Drawing Sheets

(56) References Cited

OTHER PUBLICATIONS

Leunissen, M. E.; Christova, C. G.; Hynninen, A. P.; Royall, P.; Campbell, A. I.; Imhof, A.; Dijkstra, M.; van Roij, R.; van Blaaderen, A. *Nature* 2005, 438, 235.

Tkachenko, A. V., *Phys. Rev. Lett.* 2002, 89, 148303.

Adams, M.; Dogic, Z.; Keller, S. L.; Fraden, S., *Nature* 1998, 393, 349.

Weeks, E. R.; Weitz, D. A., *Phys. Rev. Lett.* 2002, 89, 095704.

Cheng, Z.; Chaikin, P. M.; Mason, T. G., *Phys. Rev. Lett.* 2002, 59, 108303.

* cited by examiner

Figure 5

MASSIVELY PARALLEL ASSEMBLY OF COMPOSITE STRUCTURES USING DEPLETION ATTRACTION

STATEMENT REGARDING FEDERALLY SPONSORED RESEARCH OR DEVELOPMENT

This invention was made with Government support of Grant No. CHE-0450022 awarded by the National Science Foundation. The Government has certain rights in this invention.

CROSS-REFERENCE TO RELATED APPLICATION

This application claims priority to U.S. Provisional Application No. 60/898,997 filed Feb. 2, 2007, and to U.S. Provisional Application No. 60/899,036 filed Feb. 2, 2007 the entire contents of which are hereby incorporated by reference, and is a U.S. national stage application under 35 U.S.C. §371 of PCT/US2008/001443 filed Feb. 4, 2008, the entire contents of which are incorporated herein by reference.

BACKGROUND

1. Field of Invention

The present invention relates to methods of producing composite structures in parallel and to composite structures made by the methods.

2. Discussion of Related Art

One of the primary goals of synthetic colloidal chemistry is to create new kinds of particles that have a wide variety of shapes and functionalities and overall sizes in the range from a few microns to a few nanometers. The dominant approach taken by many groups worldwide is through bottom-up synthesis, including "self-assembly"[1] of atomic, molecular, and supramolecular components. Self-assembled structures can be simple, such as spheres[2], disks[3], platelets[4], and cubes[5]. They can also be more complex, such as tetrapods[6], clusters[7], liposome-microtubule complexes[8], and colloidosomes[9]. Random thermal forces cause colloidal particles to diffuse rapidly in a liquid regardless of their structures; this Brownian motion can overcome gravity and keep the particles dispersed homogenously over long times[10]. Despite the increasing sophistication of self-assembly approaches, including multi-step procedures, that have produced a rich variety of new structures[11], no universal recipe exists for creating monodisperse colloids that have arbitrarily prescribed shapes and sizes using bottom-up approaches.

One of the current inventors has demonstrated that high-throughput automated stepper lithography can be used to generate bulk dispersions of an enormous range of desirable particle shapes having exquisite fidelity in the colloidal length scale range (See PCT/US2007/018365 filed Aug. 17, 2007 assigned to the same assignee as the current application, the entire contents of which are incorporated herein by reference). These stepper-produced lithographic particles, or "LithoParticles", can be designed to have a virtually limitless diversity of crisp monodisperse shapes that have structures well below 10 microns in lateral dimensions. By contrast to most micro-electromechanical systems (MEMS)[12] applications, in which the desired structures remain attached to the wafer's surface, in our application, the LithoParticle structures, created by UV-exposure and development, are completely liberated from the wafer's surface by total lift-off into a liquid. The wafers merely serve as re-useable flat substrates for making the particles. As a demonstration of the power of this approach, we have designed and fabricated "colloidal alphabet soup": a dispersion of microscale polymer LithoParticles representing all twenty-six letters of the English alphabet in a viscous liquid. Moreover, we demonstrated control over the color and internal composition of the LithoParticle letters by incorporating red, green, and blue fluorescent dyes into them. By successively coating more than one layer of resist and exposing using different masks, we have built up complex three-dimensional LithoParticles that are not limited to simple slab-like shapes and can be used to create complex layered internal compositions. These advances represent major breakthroughs in designing model colloids over top-down efforts in micromachining[13-15] and imprintation[16] work to which we have contributed.

Figures 1A, 1D:
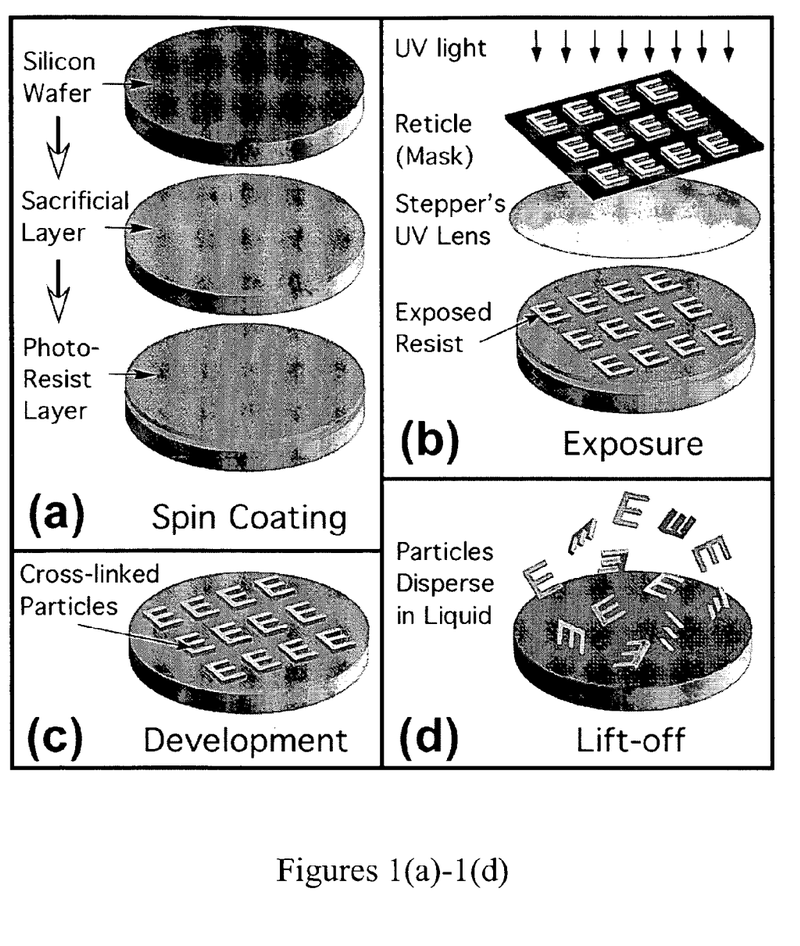
FIG. 1(a) shows spin coating of the sacrificial layer and the polymer resist layer onto a silicon wafer.
FIG. 1(d) shows lift-off: dissolving the sacrificial layer liberates the particles into liquid solution.

We can produce high-fidelity polymeric LithoParticles by the following versatile method. Polished wafers are spin-coated first with a sacrificial layer of water-soluble polymer and subsequently with a layer of UV-sensitive photoresist [FIG. 1(a)]. The thickness of the resist layer can be controlled from about 100 nm to many microns with excellent uniformity over the entire wafer's surface[12]. A high-throughput, robotically-automated, ultraviolet (UV), lithographic projection exposure system, or "stepper", is used to rapidly expose the photoresist at sub-micron feature-sizes[12]. The spin-coated wafers are exposed with the mask patterns of letters or other shapes on a photomask at 5× reduction using an Ultratech i-line stepper. This exposure causes cross-linking of the polymer resist [FIG. 1(b)]. An organic developer removes the unexposed resist without dissolving the sacrificial layer; as a result, the sacrificial layer is covered with a dense array of particles [FIG. 1(c)]. By dissolving the water-soluble sacrificial layer, the particles are lifted completely off of the surface into aqueous solution [FIG. 1(d)]. Surface charges on the particles inhibit aggregation for pH>8. Once in solution, methods of surface chemistry and solvent exchange can be used to further stabilize the particles and change the liquid from aqueous to non-aqueous[2].

The details of our synthetic procedure are as follows. LithoParticles are produced by successively spin-coating two uniform layers onto five-inch polished diameter silicon wafers. Water-soluble Omnicoat (Microchem) is initially spun onto each wafer at 3,000 rpm to produce a sacrificial layer of 0.3 μm. Next, SU-8 2001 epoxy resist in cyclopentanone is laden with red, green, and blue fluorescent dyes by adding 0.0015 g each of either Nile Red, NBD-X, or 2,6-ANS (Invitrogen) to 15 mL of SU-8 and mixing thoroughly. Each of the SU-8 solutions is then spin-coated over the sacrificial Omnicoat layers at 3,000 rpm, producing a resist layer thickness of 1.0 μm. By contrast to some photoresists, crosslinked SU-8 exhibits little optical absorption in the visible spectrum and has good chemical resistance. The density of the SU-8 after baking and removing the solvent is 1.24 g/cm3. A reticle-mask (Toppan) that contains all 26 letter of the English alphabet in high density (area fraction of approximately 50%) is created by electron beam lithography (MEBES) using a layout designed in L-Edit software (Tanner EDA). The lateral dimensions of a letter on the reticle are about 35 μm×20 μm. The wafers are then exposed to 365 nm light, using an Ultratech 2145 i-line stepper (5× reduction, 0.35 micron feature size, wavelength 365 nm) with an automated wafer handling system capable of 60 wafers/hour, at a power of 233 mJ/cm2 (optimized for feature fidelity). The lateral dimensions of the printed letters after 5× reduction by the stepper are 7 μm×4 μm with only a 1 μm pen-width. We have obtained sub-micron pen-widths for other shapes using a different mask. The wafers are developed first by organic SU-8 developer using mild agitation, and then are lifted off of the wafer surfaces into aqueous solution using water-based Omnicoat developer. After lift-off, the particles are stable against aggregation in basic solutions but can begin to aggregate if the pH is changed to be acidic. Surface functionalization and surface modification chemistry, if desired, is performed on the particle surfaces at this stage, typically immediately after lift-off before any irreversible aggregation or clumping occurs. After producing three separate bottles of monodisperse red, green, and blue fluorescent microscale letters, we mix them together to form multi-colored fluorescent colloidal alphabet soup of LithoParticles in water suitable for multi-line excitation and detection using confocal microscopy.

Figures 2A, 2E:
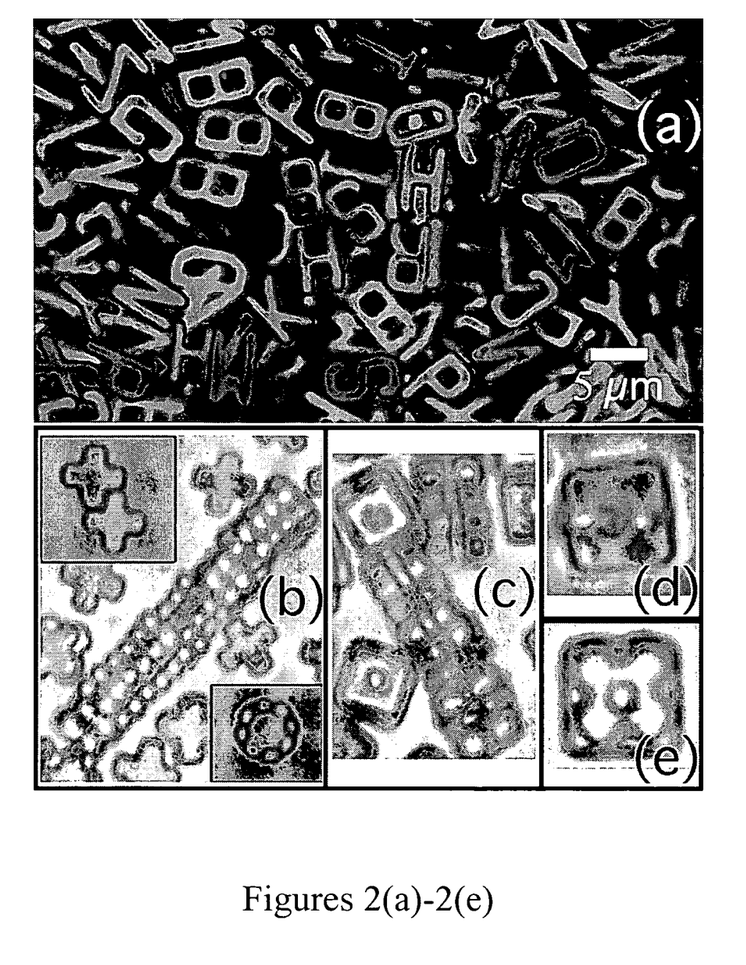
FIG. 2(a) shows a fluorescence micrograph section of multi-color "colloidal alphabet soup": an aqueous dispersion of lithographically designed colloids, or "LithoParticles", that contain red, green, and blue fluorescent dyes.
FIG. 2(e) shows a cup formed by a donut aggregating face-to-face with a cross.

Probing the thermally-driven dynamics of systems of many interacting particles that have interesting and varied non-spherical shapes in three-dimensions may help unlock the mysteries of self-assembly. Since fast 3-d confocal microscopy is an excellent tool for studying colloidal model systems, we have developed dispersions of colloidal LithoParticles that are compatible with confocal microscopy by incorporating red, green, and blue fluorescent dyes into the resist prior to spin-coating. We have optimized the concentrations of the dyes to provide bright fluorescence, yet these concentrations are low enough that we can still adjust the stepper's exposure to provide the necessary cross-linking that maintains the mechanical integrity of the particles. We have created separate aqueous solutions of red, green, and blue fluorescent microletters; after combining these solutions, we have used multi-wavelength excitation and detection laser scanning confocal microscopy (TCS SP2 AOBS laser-scanning microscope: Leica) with a 63× oil-immersion objective (NA 1.40) to obtain an image section of red, green, and blue colloidal alphabet soup [FIG. 2(a)]. After thresholding and cross-filtering the red, green, and blue channels, a composite image is created. Although some concepts of shape-dependent assembly of non-spherical disk-shaped particles driven by depletion attractions have been previously introduced to make columnar aggregates of microscale disks[3], a non-obvious application of depletion attractions with LithoParticles can be used to create columnar assemblies of crosses in which the arms of the crosses are highly aligned, interdigitated and angular offset aggregation of crosses, columnar tubes comprised of square donuts, lock-and-key aggregation caused by the insertions of an arm of a cross into the hole of a donut, and the formation of a cup by causing a donut to aggregate face-to-face with a cross [FIGS. 2(b)-(e)]. In all these examples, the small spheres used as a depletion agent, which create the depletion attraction between the larger objects, are nanoemulsion droplets[17] having an average radius of 57±5 nm at a droplet volume fraction of 0.1.

Figures 3A, 3E:
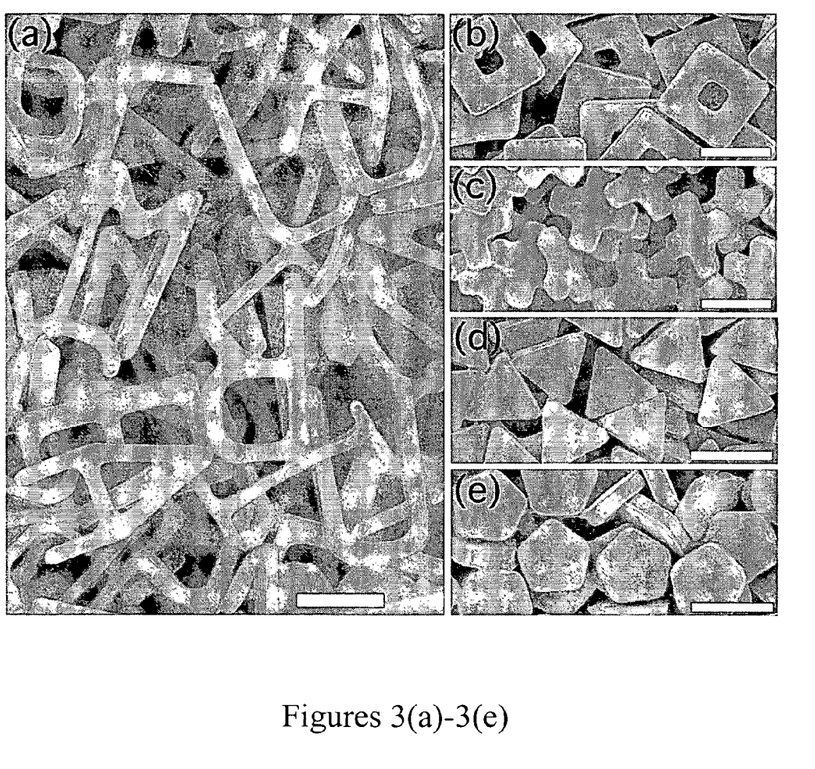
FIG. 3(a) English letters (highlights have been added).
FIG. 3(e) Pentagonal prisms.

Due to the high resolution of the stepper, the control over the shapes of the letters is exquisite. The effective width of the pen that has written the letters is about 1.0 μm, as we intended. Scanning electron microscope (SEM) images of the letters [FIG. 3(a)] reveal a striking crispness and high degree of uniformity: the polydispersities in lengths and in thicknesses of the letters are less than 10%. These SEM images are obtained by drying particles on a Ni/Cu tape (Ted Pella Inc.) and sputtering 5 nm of gold using a Hummer 6.2 Sputterer (Anatech Ltd.) to reduce charging. Images are acquired using a field emission JEOL JSM-6700F SEM at a working distance of 8 mm and at 10 kV and 10 μA. Jamming[18] and interlocking of the deposited particles is evident. Indeed, the interlocking of particles that have "arms" and "hooks" in a disordered structure is actually an unusual non-equilibrium jammed state that can support tension; simpler particle shapes, such as spheres[19] and ellipsoids[20], which can only support compression, repulsively jam but do not interlock. In addition to letters, we have designed a variety of smaller particle shapes based on a single layer: square donuts (toroidal particles with a hole), square crosses (particles with four arms in the same plane), triangular prisms, and pentagonal prisms [see FIGS. 3(b)-(e)]. The Brownian motion of these particles in solution is very noticeable. By adapting stabilization and solvent exchange procedures[21], one can match both the refractive index and the density of these particles in organic solvents.

The robotic automation of the stepper's exposure can be used to rapidly mass-produce bulk dispersions of LithoParticles. Five-inch wafers, exposed at one wafer per minute, yield roughly a quarter of a billion particles per minute, permitting the production of bulk dispersions. This production rate far surpasses that of other top-down methods, such as continuous-flow lithography[22], which has reported rates of a hundred particles per second. The stepper provides massively parallel high throughput while maintaining superior alignment and exposure fidelity arising from a mechanically stable platform. By incorporating all of the equipment for making LithoParticles into a robotically automated track system, a continuous rate of $10^8$ particles per minute can be achieved.

Figures 4A, 4D:
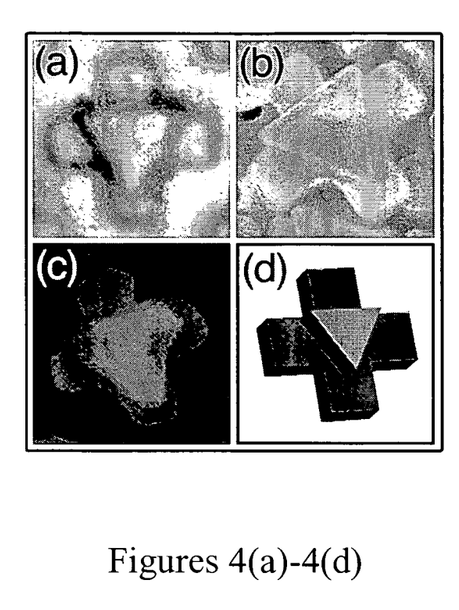
FIG. 4(a) Optical reflectance micrograph showing hybrid LithoParticle comprised of a triangle on top of a square cross.
FIG. 4(d) Schematic 3-d representation of the hybrid triangle-cross LithoParticle.

Beyond incorporating fluorescent dyes into single-layer particles, we have achieved a high level of control over the internal composition of the particles and have achieved complex multi-layer structures. For instance, we have produced both fluorescent and magnetically-responsive LithoParticles by incorporating a variety of organic dyes and organically-coated nanoparticles, such as iron-oxide, into the photoresist layer prior to exposure and crosslinking. In addition, we have created complex 3-d multilayer LithoParticles by coating and exposing layers in succession using a set of reticles that represent the cross-sections of desired 3-d shape at different heights. As a simple example, we show hybrid bilayer Janus LithoParticles that have been created by exposing a lower resist layer laden with blue fluorescent dye with the square cross pattern, and then coating a second layer of resist containing red dye, aligning, and exposing with the triangular pattern [FIG. 4]. A microscopic dark field alignment system (μ-DFAS) is used by a piezoelectric feedback system to align the previously exposed wafer with the new reticle. Holographic laser tweezers can also be used to create complex 3-d colloidal structures[23], yet the throughput and edge fidelity of the stepper-based method is much higher. Using our approach, deep-UV steppers with sub-100 nm feature sizes, could produce colloidal particles having dimensions smaller than 1 μm×0.6 μm×0.1 μm.

The high-throughput production of customizable colloidal LithoParticles by automated stepper technology may open doors for many new research directions. One very exciting area is to use confocal microscopy to study the process of thermally-driven self-assembly of differently shaped components that have controlled interactions[24]. In essence, we can use the power of top-down lithography to generate model dispersions of monodisperse colloidal LithoParticles, for example, that can enable us to study and understand the science of bottom-up self-assembly. This problem lies at the heart of understanding structure-function relationships in molecular biology, for example. In order for thermally driven self-assembly to occur in a reasonable time, Brownian motion of the components should be significant. Larger particles generated using other lithographic methods are not truly colloidal and may not be useful to explore self-assembly, because the extremely slow diffusion of larger structures make self-assembly studies impractical. By contrast, our single-layer and multi-layer fluorescent LithoParticles are small enough that dynamics, such as phase transitions and self-assembly, can be explored in three dimensions using fast confocal microscopy[25]. Indeed, deep-UV steppers could produce sub-micron LithoParticles that would diffuse and self-assemble even more rapidly.

In addition to providing model systems of complex shapes, LithoParticles can be used in a wide range of other applications. In cell biology, LithoParticles could serve as novel fluorescent probes that may be customized and adapted to study dynamic changes of microstructures inside cells. LithoParticles that have tailored surface functionalization, such as charge groups[26] or DNA[27], could provide new and interesting possibilities for creating artificial interacting architectures[24]. Single component or multicomponent model systems of LithoParticles can be used to explore the equilibrium phase behavior and phase transitions of mixtures of non-spherical shapes[28], providing a better understanding of the fundamental science of liquid crystals. LithoParticles that have arms, whether straight or curved, can jam and interlock to form unique colloidal glasses[29]. By manipulating LithoParticles with laser tweezers[30], one may be able to mark cells with a desired shape or letter. Combining top-down LithoParticles with bottom-up synthetic approaches, such as those used to form colloidosomes[9] and dense clusters[7], would offer an even greater range of interesting and potentially useful morphologies.

The advent of multi-layer monodisperse LithoParticles, including Janus LithoParticles, which have feature sizes around one micron or less, represents an important advance in lithographic colloidal dispersions. Colloidal LithoParticles exhibit significant Brownian motion and provide building blocks suitable for use in thermodynamic self-assembly driven by selective interactions, such as depletion attractions, and thermal diffusion. We have demonstrated controlled production of toroidal particles and shape-specific lock-and-key assembly. Moreover, single-layer and multi-layer particles can be made from a great range of materials, including organic, inorganic, and metallic materials.

SUMMARY

A method of producing composite structures according to some embodiments of the current invention includes dispersing a first plurality of objects in a fluid, dispersing a second plurality of objects in the fluid, the second plurality of objects having an average maximum dimension that is smaller than an average maximum dimension of the first plurality of objects, and dispersing a third plurality of objects in the fluid, the third plurality of objects having an average maximum dimension that is smaller than an average maximum dimension of the first plurality of objects. A first object of the first plurality of objects has a first mating surface region and a second object of the first plurality of objects has a first complementary mating surface region. A third object of the first plurality of objects has a second mating surface region and a fourth object of the first plurality of objects has a second complementary mating surface region. The first object and the second object aggregate together such that the first mating surface region of the first object is arranged proximate the first complementary mating surface region of the second object in response to the dispersing the second plurality of objects in the fluid due to a depletion attraction between the first and the second object. The third object and the fourth object aggregate together such that the second mating surface region of the third object is arranged proximate the second complementary mating surface region of the fourth object in response to the dispersing the third plurality of objects in the fluid due to a depletion attraction between the third and the fourth object.

BRIEF DESCRIPTION OF THE DRAWINGS

Additional features of this invention are provided in the following detailed description of various embodiments of the invention with reference to the drawings. Furthermore, the above-discussed and other attendant advantages of the present invention will become better understood by reference to the detailed description when taken in conjunction with the accompanying drawings, in which:

FIG. 1 is a schematic illustration showing a sequence for mass-producing lithographic colloids in solution using automated stepper exposure that can be used as objects for assembling composite structures according to an embodiment of the current invention. FIG. 1(b) Shows exposure: high density repeating patterns of particle shapes on the reticle (i.e. mask) are imaged by the stepper's lens onto the resist layer using ultraviolet light, thereby crosslinking the resist. FIG. 1(c) Shows development of the resist removes the uncrosslinked regions.

FIG. 2(b) shows depletion-induced assembly of colloidal crosses to form columns with a high correlation of arm alignment. Insets: side-to-side arm interdigitation locking (upper left), and face-to-face with 45 degree offset (lower right). FIG. 2(c) shows assembly of long columnar tubes comprised of donut particles. FIG. 2(d) shows lock-and-key insertion of the arm of a cross into the hole of a donut.

FIG. 3 shows Scanning electron micrographs of LithoParticles (white scale bars represent 3 μm). FIG. 3(b) Square donuts. FIG. 3(c) Square crosses. FIG. 3(d) Triangular prisms.

FIG. 4 shows hybrid bilayer Janus LithoParticles resulting from double exposure using square cross and triangle masks successively (edge length of the triangles is 2.7 μm). FIG. 4(b) Scanning electron micrograph of the hybrid triangle-cross. FIG. 4(c) Fluorescence micrograph of a triangle-cross showing blue emission from the cross and red emission from the triangle.

DETAILED DESCRIPTION OF VARIOUS EMBODIMENTS

All references cited anywhere in this specification are hereby incorporated by reference.

One of the key frontiers in mass-producing three-dimensional devices at the microscale and nanoscale is being able to manipulate and assemble constituent components reliably and in parallel. Making useful assemblies out of an array of building blocks is quite a challenging prospect. One method that could achieve this according top some embodiments of the current invention is by using shape-dependent depletion attractions to cause thermally dispersed components to assemble (i.e. aggregate) in a controlled manner. Shape-specific attractive interactions between solid particles that are dispersed in liquid solutions can be controlled to assemble differently shaped components into microscale and nanoscale composites. By introducing an agent that creates an attraction between components that has a strength that depends on the relative alignment and shapes of the components, as well as the concentration of the agent, it is possible to direct the aggregation of particulate components in a process of building up a complex device. These particulate components may be dispersions of single- and multi-component lithographically designed colloids, or they may be dispersions of particles created through bottom-up synthetic processes. To make assemblies of components in parallel simply by mixing together dispersions of the parts (shape-designed particles) in a viscous liquid and then controlling attractive interactions between them would provide a powerful means of mass-production that would go far beyond manipulation of individual components.

The inventor's previous research on mixtures of polydisperse microdisks and microspheres in an aqueous surfactant solution has revealed that a depletion attraction can be used to cause shape-selective aggregation of only the microdisks into columnar aggregates, leaving the microspheres unaggregated (T. G. Mason Phys. Rev. E 2002). The depletion attraction is a well-known short-range entropically driven interaction. The strength of the depletion interaction is proportional to the excluded volume of smaller objects between two adjacent surfaces of larger particles that are nearly touching, so the attraction is much stronger between flat surfaces than between mismatched curved surfaces. Thus, by controlling the concentration of the depletion-agent (i.e. smaller objects), one can cause disks to preferentially aggregate into columnar stacks, whereas spheres in the same solution remain dispersed. As the columnar stacks grow, their side-by-side depletion attraction becomes strong enough to overcome thermal energy and cause the stacks to aggregate into bundles. For microscale components, the depletion attraction can be created through a wide variety of additives to the solution. These depletion-creating agents include, but are not limited to: surfactant micelles, polymers, nanoscale particulates, nanoemulsions, and other small nanoscale structures or combinations thereof. In particular, the depletion-creating agent should have a size that is much less than the characteristic dimensions of the larger particles.

Some embodiments of the current invention relies on tailoring the shapes of the particles and the strength of a depletion attraction to effectively control multi-stage aggregation in order to create useful assemblies of particles. The depletion attraction can be adjusted continuously through the concentration and size of a nanoscale additive. We have created microscale lock-and-key particles of square crosses inserting an arm into the hole in square donuts (see FIG. 2 in Hernandez and Mason, J. Phys. Chem. C 111 4477-4480 (2007)). According to some embodiments of the current invention, it is possible to assemble complex devices of many shape-designed components in a hierarchical multistage aggregation process, reminiscent of the assembly of certain biomolecules. For instance, tubulin proteins form dimers and then the dimers aggregate to form tubules having long persistence lengths; these tubules result from a multistage aggregation process that has very complex dynamics. Undoubtedly, the process of growth of the tubules involves more complicated interactions than geometrically governed depletion attractions, yet it serves as an inspiring example of hierarchical aggregation.

Figure 5:
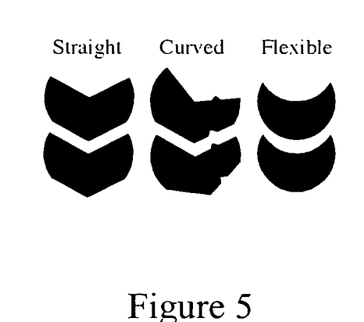
FIG. 5 shows some examples of cross-sectional areas of thin plate-like objects or longer rod-like objects having mating surface regions and complementary mating surface regions according to some embodiments of the current invention.

For instance, chevrons (FIG. 5) will assemble through the depletion attraction when nanoemulsions are added to the solution. By raising the micelle concentration to increase the depletion attraction, the individual particles will assemble columnar stacks and then the long stacks will assemble head-to-tail to form sheets. Using microscopy, one can measure the time scales associated with the stack formation and the linking of these stacks into sheets; this will enable us to measure the dynamics of multistage assembly driven by short-range attractions. By varying the particle shape, e.g. the angle of the head with respect to the tail, it can be possible to create straight sheets, curved sheets, or even flexible sheets.

One can control the strength of the depletion attraction by designing particles that have flat or curved surfaces according to embodiments of the current invention. Mating curved surfaces that are smooth can yield depletion attraction strengths that are proportional to the mating surface area. Moreover, by increasing the roughness of the surface to be comparable to the size of the depletion-agent, one can eliminate the depletion attraction between other surfaces according some aspects of the current invention. (See also copending application 60/918,896 also assigned to the assignee of the current invention, the entire contents of which are hereby incorporated by reference herein.)

One simple method for controlling the order of the assembly of different components would be to use only one depletion-agent, and continuously increase the concentration of this agent. When the concentration is low, only two mating parts that have the largest smooth mating surface areas would aggregate together. If the ratio of components has been properly adjusted, the depletion attraction, which is much larger than thermal energy, causes only these components (i.e. larger objects) to come together (i.e. aggregate) in a prescribed way with a high degree of reliability and specificity of relative position and orientation. When the concentration of the depletion-agent is further raised, then another larger object can be induced to aggregate onto a smaller mating smooth area. This process can be continued in order to force the aggregation to occur in a completely prescribed manner in a sequence of aggregation steps or "stages". An advantage of this is that many identical devices could be assembled in parallel: one could literally assemble billions of devices simultaneously in solution simply by controlling the component shapes and roughness and then just slowly ramping up the concentration of the depletion-agent. In a variation of this method, a second different depletion agent that has a different size and shape than a first depletion agent could be added to the fluid to effectively cause a second stage of aggregation after a first stage of aggregation created by a first depletion agent. Repeating this process can yield a plurality of one or more desired composite structures comprised of the larger objects that have been aggregated in desired relative positions and orientations. These relative positions and orientations can be dictated by the placement of mating surface regions and complementary mating surface regions on the surfaces of the larger objects. This placement of the mating surface regions and complementary mating surface regions can be facilitated by the use of lithographic methods to design and fabricate the larger objects. In yet another variation of this method, the volume fraction of the depletion agent, the size of the depletion agent, or a combination thereof can be manipulated by changing the temperature over a prescribed range to cause a sequential or step-wise aggregation of larger objects into a plurality of one or more desired composite structures.

Using depletion attractions, one can build microbottles, for example, and trap nanoscale polymers inside them; such bottles might have potential microscopic drug delivery applications. Multilayer lithography using different masks can be used to create cups and caps (see FIG. 2 of Hernandez and Mason, J. Phys. Chem. C 111 4477-4480 (2007)). Beyond making simple bottles, one could make the bottles sensitive to their environment, so that they open, according to some embodiments of the current invention. While still on the wafer prior to liftoff, the exposed surface of the caps could be coated with a negatively charged sulfate groups. By contrast, the exposed rim of the cup could be treated with positively charged amine groups. Each of these components would be lifted off into separate solutions, and each would remain as a stable colloidal dispersion due to the repulsion of the similarly charged particles. However, when the two solutions are combined at very dilute volume fractions in the presence of the desired biological molecule, the caps would close on the cups, preventing the escape of the biomolecules from the bottles, thereby causing the directed mass assembly of a microdevice in solution. One use more biologically relevant closing agents, such as streptavidin and biotin, to close the bottles according to some embodiments of the current invention. Opening the bottles could then be triggered by the introduction of specific enzymes for cleaving these linkages or by pH. With microbottles based on this principle, it may be possible to deliver drugs microscopically to areas in the body that have an abundance of certain enzymes (e.g. caused by cancer) when these enzymes unwittingly open the microbottles.

Moreover, by decorating particular sites on the component particles with different surface functionalities, one can make dispersions of multi-component particle assemblies with even greater specificity. This decoration can be done by patterning the surfaces of particles still on the wafer prior to lift off in either stepper-lithography approaches or templating approaches. These sites could be decorated with complimentary glue molecules (e.g. streptavidin and biotin), thereby forcing strong shear-rigid bonds in places that are desired. By contrast, aggregates formed by depletion attractions tend to maintain a lubricating layer of liquid between the parts, offering the flexibility of having devices with moving parts that nevertheless remain together. To rigidly fix the parts in place once the depletion attractions have organized them in a controlled manner, one can change the temperature, pH, or ionic strength to cause the particles to irreversibly aggregate (i.e. permanently bond) in the primary van der Waals attractive minimum. Alternatively, molecules or nanoparticles could be added to the fluid to cause such irreversible aggregation or permanent bonding between the proximate surfaces.

The term "mating surface region" is intended to refer to a portion of a surface of an object that is suitable to be attracted to a portion of a surface of another object, referred to as its "complementary mating surface region," more strongly that surface regions of said particles that immediately surround the mating surface region and the complementary mating surface region. (See FIG. 5 for some examples. It is arbitrary which surface region is referred to as the "mating surface region" and the "complementary mating surface region." The terminology is intended to facilitate a description of pairs of surface regions that can be aggregated by depletion attraction.) The object that has the mating surface region and the object that has the complementary mating surface region may have substantially the same or different overall structures according to some embodiments of the current invention. For example, in one embodiment, one could have a large plurality of objects that are all substantially the same in composition, shape, size, and surface structure. In such a case all of the plurality of objects will each have both a mating surface region and a complementary mating surface region. However, the invention is not limited to this particular embodiment. In some embodiments, the mating surface region may be on an object that has a different composition, shape, size, and/or surface structure than the object that has the complementary mating surface region. The mating surface region and the complementary mating surface region may be flat or curved according to various embodiments of the current invention. In an embodiment in which the mating surface region and the complementary surface region are flat, the mating surface region can be substantially the same as the complementary surface region. In such a case, it is possible for a surface region of the object to serve as both a mating surface region and a complementary mating surface region. In another embodiment of the current invention, a mating surface region may have a convex curved shape, for example, and the complementary mating surface region has a concave curved shape so that the mating surface region and the complementary mating surface region can be arranged either in contact with each other or in close proximity with a thin layer of material between them. For example, in one embodiment, such curved surface may have a structure that permits essentially all of at least one of the curved surfaces to be arranged in close proximity to the other curved surface. One can see that there are a large number of possible variations of designing, or otherwise obtaining, mating and complementary mating surface regions according to the teachings of the current invention such that they provide desired depletion attractions to each other in fluids having selected dispersions of smaller objects therein, thereby permitting one to selectively control the production of composite structures, in parallel, that can each have many components. In addition, other portions of the surfaces of the objects (other than the mating surface regions and complementary mating surface regions) can be designed with edges, depressions, incompatible curvatures, or protrusions and the like to inhibit mating there. These inhibiting features can also be used in combination with mating surface features to also force a pre-specified alignment of the objects that have aggregated together at the mating and complementary mating surface regions.

Bigger particles typically have to experience significant rearrangements and explore many different configurations so that they can approach one another in a wide variety of relative positions and orientations so that the desired mating configuration can be found in a reasonable period of time. Thermally driven diffusion (Brownian motion) can enable this for smaller particles according to an embodiment of the current invention, but other forms of stirring or mechanical agitation might also be used to make this happen according to other embodiments of the current invention.

The repulsive part of the interaction potential between the surfaces of the larger particles should not be so long in range that it would preclude the approach of the mating surfaces at distances that are comparable to or smaller than the size of the depletion agent. Yet, some repulsion is needed to prevent aggregation of these larger components without the depletion agent. For example, bigger particles can have a short-range surface repulsion that has a range that is comparable to or smaller than the size of the depletion agent according to an embodiment of the current invention.

There can be one or more than one kind of depletion agent according to some embodiments of the current invention. For example, one can add depletion agents of different sizes to control the depletion attraction and the aggregation processes according to some embodiments of the current invention.

Depletion agents can be micelles, nanoparticles, nanodroplets, polymers, vesicles, quantum dots, colloidal particles, biopolymers, bio-colloids, and the like, according to some embodiments of the current invention. Depletion agents do not have to be spherical objects, and they can by facetted nanocrystals or even rod-like nanoparticles or micelles.

The plurality of objects that are being aggregated together to make composite structures can be, according to some embodiments of the current invention, particles made using at least one of the following methods related to lithography: an optical lithography exposure device, a mask aligner, an optical stepper, a deep ultraviolet stepper, an ultraviolet stepper, a step-and-flash exposure system, a step-and-scan exposure system, an electron beam lithography exposure device, an ion beam exposure device, a laser exposure device, a sputterer, a reactive ion etcher, a deep reactive ion etcher, a plasma, a developer, a spin-coater, an electron beam deposition system, physical vapor deposition, chemical vapor deposition, mechanical imprinting, stamping, extrusion, injection molding, nanoimprint lithography, mechanical cutting, mechanical toming, microlens arrays, continuous flow lithography, stop flow lithography, dip-pen lithography, and holographic optical exposure.

The plurality of objects that are being aggregated together to make composite structures can be, according to some embodiments of the current invention, microscale or nanoscale particles made lithographically using at least one of: spatially patterned radiation, mechanical imprinting, stamping, nanoimprinting, step-and-flash nanoimpriting, dip-pen lithography, relief deposition templating.

The verb "aggregate" when used in the context of attractive interactions between two proximate objects created by depletion attractions refers to the creation of an attractive interaction energy between the complementary mating surface regions of said two proximate objects that is substantially stronger than thermal energy, $k_BT$, where $k_B$ is Boltzmann's constant and T is the temperature. In most cases, a thin layer of lubricating fluid of the continuous phase will continue to remain between the complementary mating surface regions even after two objects "aggregate" by a depletion attraction. By adjusting the size and volume fraction of the smaller depletion agent, it is frequently possible to make the attractive interaction energy between complementary mating surfaces many times $k_BT$ so that once larger objects aggregate together, they do not later become un-aggregated if the concentration of the depletion agent is not altered. If reducing or eliminating the concentration of the depletion agent is desired after forming a composite structure of aggregated objects, then it may be necessary to permanently connect, fuse together, permanently attach, directly contact, or irreversibly bond the complementary mating surfaces of the objects according to some embodiments of the current invention.

After a stage in the assembly of the desired composite structure occurs, one can permanently and irreversibly bond attracted surfaces of particles together through a thermal process, a chemical process, a reaction, an irreversible bonding, an acoustic process, or a pressure process in some embodiments of the current invention. In referring to this process of permanently bonding or connecting a portion of the nearby surfaces of two proximate neighboring larger objects together irreversibly, we say the larger objects "irreversibly bond together" or "irreversibly aggregate" to distinguish this process from the one in which we only use the sole word "aggregate" to refer to the process by which portions of the surfaces of larger objects are attracted together by a depletion attraction. However, the general aspects of the invention are not limited to only permanently and irreversibly bonding components of the composite structures. For example, other embodiments may allow components of the composite structures to remain separated by a layer of the continuous liquid phase or an anti-clumping material between them which can act as a lubricating layer in some embodiments. This can be useful to form a composite structure having moving parts.

The term "clumping" when used in the context of describing the positional structure of larger objects, refers to non-specific aggregation of the larger objects into aggregate structures, or "clumps", that are typically undesirable and do not have the organization of the desired composite structures. If the larger objects are not properly stabilized in the fluid, then clumping can occur by a variety of types of attractive interactions other than a depletion attraction prior to the introduction of any depletion agent. To prevent clumping, the surfaces of the larger objects can be modified with a stabilizing agent that provides a very short-range repulsion between the surfaces of the objects. Typically, this repulsive interaction is shorter in range or at most comparable to the size of the depletion agent that is introduced to create a depletion attraction. Once treated, the stabilizing agent that modified the surfaces of the objects can be removed and the objects will remain stably dispersed in the fluid even after the stabilizing agent is subsequently removed from the fluid. Another method of precluding clumping involves adding anti-clumping agents to the fluid prior to dispersing the larger objects in it. It is possible to choose an anti-clumping agent that acts to stabilize the dispersion of larger objects against clumping without interfering in an undesirable manner with the depletion attraction created by the subsequent addition of the depletion agent.

As noted above, in some embodiments there may be no need for an anti-clumping agent to be introduced into the fluid if stabilizing charge groups have been chemically bonded to the particles' surfaces. This pre-treatment of the particles to inhibit clumping without introducing an anti-clumping agent can be a preferred method in some embodiments of the current invention. Methods of surface modification of particles can include: functionalizing, grafting, covalently bonding, adsorbing, coating, ionically bonding, and encapsulating with materials such as a polymer, a co-polymer, a graft co-polymer, a surface-active nanoparticle, a lipid, an amphiphilic molecule, a biomolecule, a derivatized biomolecule, a polyanion, a protein, a capsid protein, a polypeptide, a co-polypeptide, a nucleic acid, a single-stranded deoxyribonucleic acid, a double-stranded deoxyribonucleic acid, a ribonucleic acid, a polyethylene glycol, an albumin, and an oligomer of a nucleic acid.

The whole system, including the fluid, objects for assembly, depletion agents and anti-clumping agents, can be rotated to prevent gravity-driven separation through sedimentation or creaming as the composite structures become larger in some embodiments of the current invention. If the component objects and/or composite structures are sufficiently small, thermal energy alone may be sufficient to keep them dispersed in the fluid through Brownian motion.

According to some embodiments of the current invention, a plurality of composite structures can be mass-produced with a defect rate (error rate) in the production of less than about ten percent and typically less than about one percent.

Also, one or more sets of objects may be dispersed in excess in the fluid according to some embodiments of the current invention so that the number of composite structures produced can be limited by the number of only one species of larger components. Furthermore, composite structures can be produced from objects that are assembled in a predetermined order through portions of mating surface regions of two or more larger objects.

The ratios of the volume fractions of different types of larger objects in the fluid can be adjusted to provide an appropriate stoichiometry of objects that have complementary mating surface regions that will yield a predetermined desired ratio of one or more composite structures as products. Subsequently, adding the smaller objects as a depletion agent that induces the aggregation of the larger objects through a depletion attraction, can cause the composite structures to form in a desired ratio. Exact matching of the volume fractions of specific types of larger objects can be desirable if there is a one-to-one correspondence in the complementary mating surface regions between such larger objects. In other embodiments of the present invention, a two-to-one ratio of the volume fraction of the different types of larger objects, or even larger ratios or fractional ratios, can be desirable.

The time required to form the composite structures at an acceptably low error rate of less than about ten percent, and typically less than one percent, according to some embodiments of the current invention are governed largely by the viscosity of the fluid material in which all of the objects are dispersed and the size and the volume fraction of the larger objects. Using a low viscosity fluid is frequently desirable because the translational and rotational diffusion rates of the larger objects are faster, enabling them to encounter each other in a range of positions and orientations that provide at least a partial overlap of portions of the complementary mating surface regions on different objects. A partial overlap of portions of the complementary mating surface regions is often sufficient to create a strong enough depletion attraction energy compared to thermal energy that the mating surface regions will remain in close proximity and can then rapidly find a configuration in which the depletion attraction between the mating surface regions is maximized. For microscale objects dispersed in water at a volume fraction of 0.001, typically a few minutes to a few hours is required to mass produce many copies of the desired composite structure in the water. It is sometimes desirable to use reduced volume fractions of objects even below 0.001, although the times for the plurality of desired composite structures to form with an acceptably low level of errors may be many hours, days, or even weeks.

By analogy to reactions of smaller building blocks into larger molecular species in chemistry, it is possible and sometimes desirable to simultaneously form several different composite structures of objects that represent some or all possible isomers of a general composite structure, rather than one unique composite structure after the depletion agent is added to the fluid.

In a method of producing composite structures according to an embodiment of the current invention, the first plurality of objects includes a first sub-plurality of objects having substantially uniform composition, shape, size, and surface structure to each other and a second sub-plurality of objects having substantially uniform composition, shape, size, and surface structure to each other and at least one of a different composition, a shape, a size and a surface structure from the first sub-plurality of objects.

In a method of producing composite structures according to an embodiment of the current invention, the first mating surface region and the first complementary mating surface region of said first and second objects, respectively, are each greater in surface area than the surface area of each the second mating surface region and the second complementary mating surface region of the third and fourth objects, respectively, so that the dispersing said second plurality of objects selectively causes aggregation of the first and second objects without also causing aggregation of the third and fourth objects.

In a method of producing composite structures according to an embodiment of the current invention, the third plurality of objects dispersed in the fluid are substantially the same in composition, shape, size, and surface structure as the second plurality of objects, the dispersing said third plurality of objects in the fluid thus effectively providing an increase in concentration of the second plurality of objects in the fluid to cause aggregation of the third and fourth objects while still maintaining aggregation of the first and second objects.

In a method of producing composite structures according to an embodiment of the current invention, the average maximum dimension of the first plurality of objects is at least about 50 nm and not larger than about 100 µm.

In a method of producing composite structures according to an embodiment of the current invention, at least some of the first plurality of objects have surfaces modified to prevent clumping prior to being dispersed in the fluid.

In a method of producing composite structures according to an embodiment of the current invention, the first plurality of objects dispersed in the fluid has a volume fraction thereof that is at least greater than about $10^{-6}$ and less than about 0.3.

In a method of producing composite structures according to an embodiment of the current invention, the second plurality of objects dispersed in the fluid has a volume fraction thereof that is at least greater than about $10^{-6}$ and less than about 0.3.

In a method of producing composite structures according to an embodiment of the current invention, the third plurality of objects dispersed in the fluid has a volume fraction thereof that is at least greater than about $10^{-5}$ and less than about 0.3.

In a method of producing composite structures according to an embodiment of the current invention, the fluid has a viscosity that is at least greater than about $10^{-4}$ Poise and less than about $10^2$ Poise.

In a method of producing composite structures according to an embodiment of the current invention, the first mating surface region has a surface roughness that is less than the average maximum dimension of the second plurality of objects and the second mating surface region has a surface roughness that is less than the average maximum dimension of the second plurality of objects.

In a method of producing composite structures according to an embodiment of the current invention, surface regions other than the first and second mating surface regions have surface roughness that are greater than the average maximum dimension of the second plurality of objects.

In a method of producing composite structures according to an embodiment of the current invention, a plurality of composite structures form from the first plurality of objects.

In a method of producing composite structures according to an embodiment of the current invention, a plurality of composite structures form, each having at least three of the first plurality of objects combined together.

In a method of producing composite structures according to an embodiment of the current invention, the first plurality of objects are lithographically produced objects having substantially predetermined shapes.

In a method of producing composite structures according to an embodiment of the current invention, the first plurality of objects are photo-lithographically produced objects having substantially predetermined shapes.

In a method of producing composite structures according to an embodiment of the current invention, the first plurality of objects are themselves composite structures produced by a prior application of a method of the current invention.

The invention has been described in detail with respect to various embodiments, and it will now be apparent from the foregoing to those skilled in the art that changes and modifications may be made without departing from the invention in its broader aspects, and the invention, therefore, as defined in the claims is intended to cover all such changes and modifications as fall within the true spirit of the invention.

REFERENCES (1) Whitesides, G. M.; Grzybowski, B. *Science* 2002, 295, 2418.
(2) Anti, L.; Goodwin, J. L.; Hill, R. D.; Ottewill, R. H.; Owens, S. M.; Papworth, S.; Waters, J. A. *Colloid Surf.* 1986, 17, 67.
(3) Mason, T. G. *Phys. Rev. E* 2002, 66, 60402.
(4) van der Kooij, F. M.; Kassapidou, K.; Lekkerkerker, H. N. W. *Nature* 2000, 406, 868.
(5) Murphy, C. *Science* 2002, 298, 2139.
(6) Mokari, T.; Rothenberg, E.; Popov, I.; Costi, R.; Banin, U. *Science* 2004, 304, 1787.
(7) Manoharam, V. N.; Elsesser, M. T.; Pine, D. J. *Science* 2003, 301, 483.
(8) Raviv, U.; Needleman, D. J.; Li, Y.; Miller, H. P.; Wilson, L.; Safinya, C. R. *Proc. Nat. Acad. Sci.* 2005, 102, 11167.
(9) Dinsmore, A. D.; Hsu, M. F.; Nikolaides, M. G.; Marquez, M.; Baush, A. R.; Weitz, D. A. *Science* 2002, 298, 1006.
(10) Russel, W. B.; Saville, D. A.; Schowalter, W. R. *Colloidal Dispersions*; Cambridge Univ. Press: Cambridge, 1989.
(11) van Blaaderen, A. *Nature* 2006, 439, 545.
(12) Madou, M. J. *Fundamentals of Microfabrication: The Science of Miniaturization,* 2nd ed. ed.; CRC Press: Boca Raton, 2002.
(13) Higurashi, E.; Ukita, H.; Tanaka, H.; Ohguchi, O. *Appl. Phys. Lett.* 1994, 64, 2209.
(14) Brown, A. B. D.; Smith, C. G.; Rennie, A. R. *Phys. Rev. E* 2000, 62, 951.
(15) Sullivan, M.; Zhao, K.; Harrison, C.; Austin, R. H.; Megens, M.; Hollingsworth, A.; Russel, W. B.; Cheng, Z.; Mason, T. G.; Chaikin, P. M. *J. Phys. Condens. Matter* 2003, 15, S11.
(16) Rolland, J. P.; Maynor, B. W.; Euliss, L. E.; Exner, A. E.; Denison, G. M.; DeSimone, J. M. *J. Am. Chem. Soc.* 2005, 127, 10096.
(17) Mason, T. G.; Wilking, J. N.; Meleson, K.; Chang, C. B.; Graves, S. M. *J. Phys.: Condens. Matter* 2006, 18, R635.
(18) Liu, A. J.; Nagel, S. R. *Nature* 1998, 396, 21.
(19) Torquato, S.; Truskett, T. M.; Debenedetti, P. G. *Phys. Rev. Lett.* 2000, 84, 2064.
(20) Donev, A.; Cisse, I.; Sachs, D.; Variano, E. A.; Stillinger, F. H.; Connelly, R.; Torquato, S.; Chaikin, P. M. *Science* 2003, 303, 990.
(21) Yethiraj, A.; van Blaaderen, A. *Nature* 2003, 421, 513.
(22) Dendukuri, D.; Pregibon, D. C.; Colloins, J.; Hatton, T. A.; Doyle, P. S. *Nature Mater.* 2006, 5, 365.
(23) Korda, P.; Spalding, G. C.; Dufresne, E. R.; Grier, D. G. *Rev. Sci. Instr.* 2002, 73, 1956.
(24) Frenkel, D. *Nature Mater.* 2006, 5, 85.
(25) Gasser, U.; Weeks, E. R.; Schofield, A.; Pusey, P. N.; Weitz, D. A. *Science* 2001, 292, 258.
(26) Leunissen, M. E.; Christova, C. G.; Hynninen, A. P.; Royall, P.; Campbell, A. I.; Imhof, A.; Dijkstra, M.; van Roij, R.; van Blaaderen, A. *Nature* 2005, 438, 235.
(27) Tkachenko, A. V. *Phys. Rev. Lett.* 2002, 89, 148303.
(28) Adams, M.; Dogic, Z.; Keller, S. L.; Fraden, S. *Nature* 1998, 393, 349.
(29) Weeks, E. R.; Weitz, D. A. *Phys. Rev. Lett.* 2002, 89, 095704.
(30) Cheng, Z.; Chaikin, P. M.; Mason, T. G. *Phys. Rev. Lett.* 2002, 89, 108303.

I claim:

1. A method of producing composite structures, comprising:
   dispersing a first plurality of objects in a fluid;
   dispersing a second plurality of objects in said fluid, said second plurality of objects having an average maximum dimension that is smaller than an average maximum dimension of said first plurality of objects; and
   dispersing a third plurality of objects in said fluid, said third plurality of objects having an average maximum dimension that is smaller than an average maximum dimension of said first plurality of objects,
   wherein a first object of said first plurality of objects is lithographically produced such that it has a first mating surface region comprising a convex surface portion and a second object of said first plurality of objects is lithographically produced such that it has a first complementary mating surface region comprising a concave surface portion that is complementary with said convex surface portion,
   wherein a third object of said first plurality of objects has a second mating surface region and a fourth object of said first plurality of objects has a second complementary mating surface region,
   wherein said first object and said second object aggregate together such that said first mating surface region of said first object is arranged proximate said first complementary mating surface region of said second object in response to said dispersing said second plurality of objects in said fluid due to a depletion attraction between said first and said second object, and
   wherein said third object and said fourth object aggregate together such that said second mating surface region of said third object is arranged proximate said second complementary mating surface region of said fourth object in response to said dispersing said third plurality of objects in said fluid due to a depletion attraction between said third and said fourth object.

2. A method of producing composite structures according to claim 1, wherein said first plurality of objects comprises a first sub-plurality of objects having substantially uniform composition, shape, size, and surface structure to each other and a second sub-plurality of objects having substantially uniform composition, shape, size, and surface structure to each other and at least one of a different composition, a shape, a size and a surface structure from said first sub-plurality of objects.

3. A method of producing composite structures according to claim 1, wherein said first mating surface region and said first complementary mating surface region of said first and second objects, respectively, are each greater in surface area than the surface area of each said second mating surface region and said second complementary mating surface region of said third and fourth objects, respectively, so that said dispersing said second plurality of objects selectively causes aggregation of said first and second objects without also causing aggregation of said third and fourth objects.

4. A method of producing composite structures according to claim 1, wherein said third plurality of objects dispersed in said fluid are substantially the same in composition, shape, size, and surface structure as said second plurality of objects, said dispersing said third plurality of objects in said fluid thus effectively providing an increase in concentration of said second plurality of objects in said fluid to cause aggregation of said third and fourth objects while still maintaining aggregation of said first and second objects.

5. A method of producing composite structures according to claim 1, wherein said average maximum dimension of said first plurality of objects is at least about 50 nm and not larger than about 100 µm.

6. A method of producing composite structures according to claim 1, wherein said first plurality of objects dispersed in said fluid has a volume fraction thereof that is greater than about $10^{-6}$ and less than about 0.3.

7. A method of producing composite structures according to claim 6, wherein said second plurality of objects dispersed in said fluid has a volume fraction thereof that is greater than about $10^{-6}$ and less than about 0.3.

8. A method of producing composite structures according to claim 7, wherein said third plurality of objects dispersed in said fluid has a volume fraction thereof that is greater than about $10^{-5}$ and less than about 0.3.

9. A method of producing composite structures according to claim 1, wherein said fluid has a viscosity that is greater than about $10^{-4}$ Poise and less than about $10^{2}$ Poise.

10. A method of producing composite structures according to claim 1, wherein said first mating surface region has a surface roughness that is less than said average maximum dimension of said second plurality of objects and said second mating surface region has a surface roughness that is less than said average maximum dimension of said second plurality of objects.

11. A method of producing composite structures according to claim 1, wherein a plurality of composite structures form from said first plurality of objects.

12. A method of producing composite structures according to claim 7, wherein a plurality of composite structures form each having at least three of said first plurality of objects combined together.

13. A method of producing composite structures according to claim 1, wherein said first plurality of objects are photolithographically produced objects having predetermined shapes.

14. A method of producing composite structures according to claim 1, wherein said first plurality of objects are themselves composite structures produced by a prior application of the method of claim 1.

* * * * *